United States Patent [19]
Ridel

[11] Patent Number: 4,509,022
[45] Date of Patent: Apr. 2, 1985

[54] AMPLIFIER CIRCUIT WITH AUTOMATIC GAIN CONTROL AND HEARING AID EQUIPPED WITH SUCH A CIRCUIT

[75] Inventor: Philippe Ridel, Bois d'Ennebourg, France

[73] Assignee: U.S. Philips Corporation, New York, N.Y.

[21] Appl. No.: 470,745

[22] Filed: Feb. 28, 1983

[30] Foreign Application Priority Data
Mar. 1, 1982 [FR] France ................ 82 03347

[51] Int. Cl.³ .............................................. H03G 3/20
[52] U.S. Cl. ................................... 330/284; 330/145; 381/121
[58] Field of Search ................ 330/145, 284; 381/120, 381/121

[56] References Cited
U.S. PATENT DOCUMENTS
3,248,642 4/1966 Rothschild ................ 330/284 X
3,725,800 4/1973 Papay ................ 330/145 X
4,079,335 3/1978 Doerig ................ 330/145 X Primary Examiner—James B. Mullins
Assistant Examiner—Steven J. Mottola
Attorney, Agent, or Firm—Robert T. Mayer; Bernard Franzblau

[57] ABSTRACT

An amplifier system comprising an input transducer, an amplifier and an output transducer connected in cascade, and an automatic gain control circuit comprising a variable resistor for taking off a voltage which varies with the signal from the input transducer and supplies said voltage to a rectifier and an RC filter. The filter output is connected to the base of a first transistor having a collector that directly drives the base of a second transistor which is connected to the input of the amplifier in such a way that it bypasses the input signal of said amplifier to a greater extent as the signal across the variable resistor increases.

15 Claims, 1 Drawing Figure

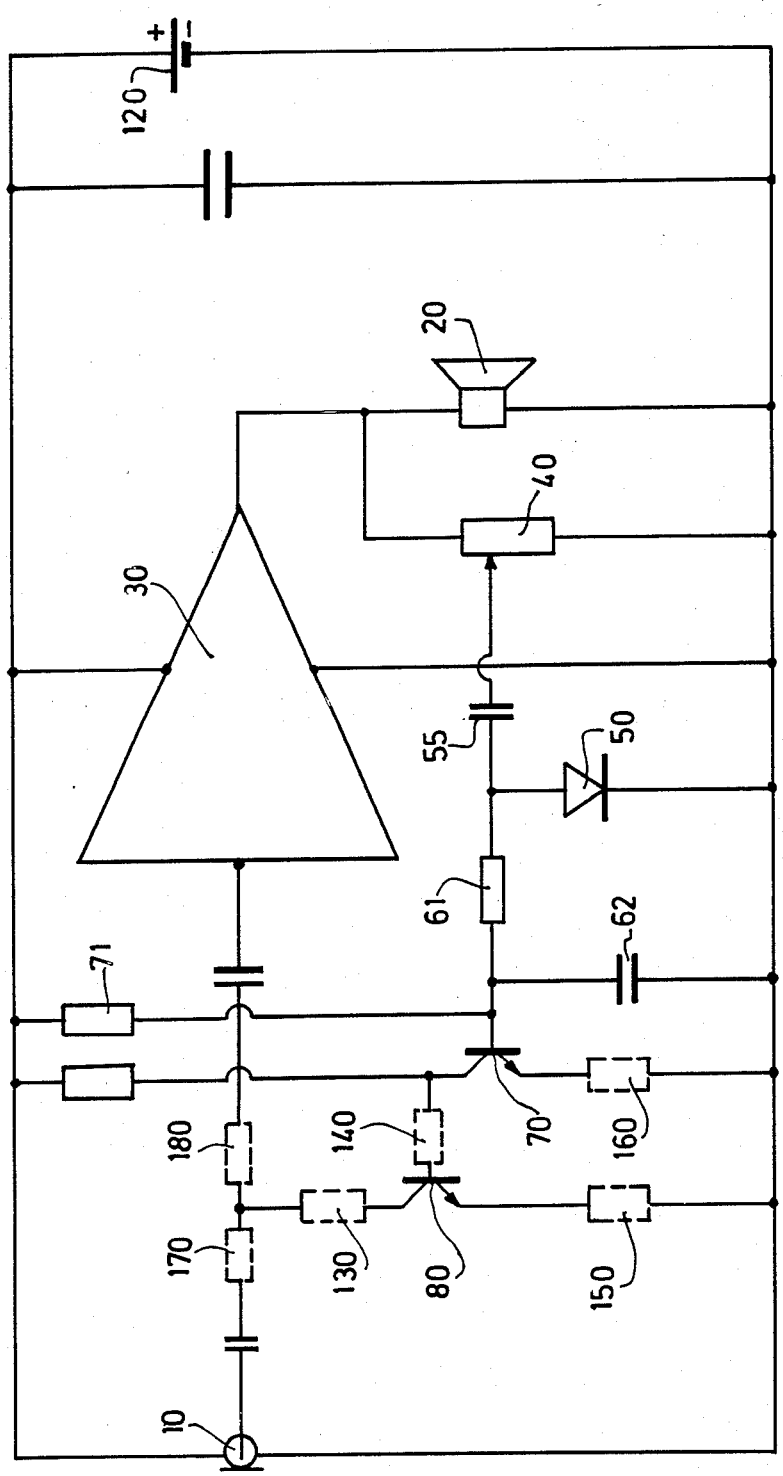

AMPLIFIER CIRCUIT WITH AUTOMATIC GAIN CONTROL AND HEARING AID EQUIPPED WITH SUCH A CIRCUIT

The invention relates to an amplifier circuit with automatic gain control, which circuit comprises an input transducer, an amplifier, an output transducer, and an automatic gain control circuit comprising a variable resistor, for taking-off an alternating voltage, the amplitude of which is in relation with the signal from the input transducer, a rectifier, and an RC-filter. In particular in hearing aids, which must provide a high gain for weak sounds and a low gain for loud sounds, such a circuit may be utilized in order to bring all these sounds within an acceptable range.

A common control method used in such circuits is to rectify the signal taken from an arbitrary point in the amplifier stage, to amplify this signal if necessary, to filter the signal, and to use the resulting direct voltage, which varies with the level of said signal, for controlling the base bias of a transistor outside the amplifier circuit. In order to obtain the desired automatic gain control the collector-emitter resistance of this transistor, whose base receives said direct voltage, may be used as a variable resistance in parallel or in series with the input of one of the transistors of the amplifier circuit. Such an automatic gain control circuit using the series-arrangement principle is described in the Applicant's French patent application No. 7421832 filed on June 24, 1974 and published under No. 2276756.

The parallel arrangement, which is advantageous in view of harmonic distortion, generally has the drawback that two junctions are arranged in series between the terminals of the power-supply source, which is not permissible in the case of silicon devices and in the case of the particularly low power-supply voltages (of the order of 1.3 V) used in hearing aids.

It is an object of the invention to provide an amplifier circuit with automatic gain control which eliminates this drawback. An amplifier circuit of the type mentioned in the opening sentence is characterized in that the output of the filter is connected to the base of a first transistor whose collector directly drives the base of a second transistor which is connected to the input of the amplifier in such a way that it attenuates the input signal of said amplifier to a greater extent as the signal across the variable resistor increases. In accordance with the invention the final stage of this circuit comprises two transistors which are coupled directly in such a way that the collector of the first transistor drives the base of the second transistor and the second transistor, whose conduction is inversely proportional to that of the first transistor, gradually attenuates the input of the amplifier circuit. Moreover, these transistors are arranged in such a way that their base-emitter junctions and the junction of the rectifier are in parallel so that the aforementioned drawback is eliminated.

The invention will now be described in more detail, by way of example, with reference to the accompanaccompanying drawing which shows an embodiment of an amplifier circuit equipped with an automatic gain control circuit.

In this embodiment the amplifying system comprises an amplifier circuit which, in this order, comprises an input transducer, in the present case a microphone 10 having three connections, an amplifier 30, and an output transducer, in the present case a receiver 20. The system also comprises the automatic gain control circuit for said amplifier circuit. The gain control circuit comprises a variable resistor 40, by means of which a fraction of the alternating voltage across the receiver 20 can be taken off, a diode 50 and a capacitor 55 for rectifying said alternating voltage, and an RC filter. In addition, there are two transistors 70 and 80 which are coupled directly with the collector of the first transistor driving the base of the second transistor.

Via a resistor 71, which in the present case is connected to the positive terminal of the power-supply source 120 (but which is connected to the negative terminal in the case of transistors of the inverse conductivity type), the base of the first transistor 70 is biased by a voltage such that the base-emitter junction, which is connected in parallel with the diode 50, is saturated. The collector voltage of the transistor 70 is then lower than the normal bias voltage of the base of transistor 80 so that this transistor is not conductive. Consequently, no compression effect occurs. The automatic gain control circuit is not activated until the alternating voltage taken from the resistor 40 exceeds a certain amplitude. The signals detected by the diode 50 and filtered by the resistor 61 and the capacitor 62 then reduce the base voltage of transistor 70, whose collector voltage increases so that the collector-emitter resistance of the transistor 80 decreases. The transistor 80 is turned on and the compression effect gradually manifests itself, and increases in accordance with the the amplitude of the signals taken off and detected by the automatic gain control circuit.

This gain control is found to have a very wide range as a result of the gain provided by the first transistor 70. The level at which the compression effect begins and the slope of the input/output transfer characteristic depend on the values of the resistors 130 to 180, shown by broken lines in the FIGURE.

It is evident that the present invention is not limited to the embodiment described in the foregoing, to which several modifications are possible within the scope of the invention. For example, the resistor 40 may be connected to the input of the amplifier 30 instead of to the output and, if the efficiency of the gain control must then be increased, an auxiliary amplifier may be arranged in the circuit between the input of the amplifier 30 and the resistor 40 or between this resistor and the rectifier 50. It is also evident that the invention may be utilised in any amplifier system, although it is particularly suitable for use in hearing aids.

What is claimed is:

1. An amplifier circuit with automatic gain control comprising, in cascade, an input transducer, an amplifier, and an output transducer, and an automatic gain control circuit comprising a variable resistor for taking off an alternating voltage the amplitude of which varies with a signal from the input transducer, a rectifier and an RC-filter responsive to said alternating voltage, and means connecting an output of the filter to a base of a first transistor having a collector that directly drives a base of a second transistor connected to an input of the amplifier such that it attenuates an input signal of said amplifier to a greater extent as the signal across the variable resistor increases, and wherein said first and second transistors are of the same conductivity type whereby an increase in conduction of the first transistor produces a decrease in conduction of the second transistor.

2. An amplifier circuit as claimed in claim 1, characterized in that the variable resistor is connected to the terminals of the output transducer for taking off a fraction of the output signal of the amplifier.

3. An amplifier circuit as claimed in claim 1, characterized in that the variable resistor is connected to the input terminals of the amplifier.

4. A hearing aid comprising a microphone, an amplifier circuit and a receiver connected in cascade, and wherein the amplifier circuit includes an automatic gain control circuit as claimed in claim 1.

5. A hearing aid including an amplifier circuit as claimed in claim 2 wherein the input transducer comprises a microphone and the output transducer comprises a loudspeaker device.

6. An amplifier circuit with automatic gain control comprising: an input terminal for connection to an input transducer that supplies a signal voltage, an output terminal for supplying a signal voltage to an output transducer, an amplifier having an input coupled to the input terminal and an output coupled to the output terminal, and an automatic gain control circuit comprising:

a variable resistor coupled to said amplifier for taking off an alternating voltage that varies in amplitude with the signal voltage, means responsive to said alternating voltage for deriving a DC voltage proportional thereto, first and second transistors each having first and second electrodes that define a main current path and a control electrode for controlling the current in the respective main current path, means coupling the first transistor to an output of the DC voltage deriving means so that a rectifying junction between the control electrode and the first electrode of said transistor is connected in parallel with the output of the DC voltage deriving means, means coupling the second transistor to the input of the amplifier and the control electrode thereof directly to the second electrode of the first transistor so that the second transistor attenuates the input signal of said amplifier as a function of the amplitude of the alternating voltage of the variable resistor, said second transistor having a rectifying junction formed between its control electrode and its first electrode and connected across the first and second electrodes of the first transistor.

7. An amplifier circuit as claimed in claim 6 wherein said first and second transistors are of the same conductivity type.

8. An amplifier circuit as claimed in claim 6 wherein the control, the first and the second electrodes of the first and second transistors comprise the base, emitter and collector electrodes, respectively.

9. An amplifier circuit as claimed in claim 8 wherein the base-emitter current paths of the first and second transistors are connected in circuit such that the base-emitter current of the second transistor does not flow through the first transistor.

10. An amplifier circuit as claimed in claim 6 further comprising means for applying a DC bias to the control electrode of the first transistor such as to bias the first transistor into a saturated condition.

11. An amplifier circuit with automatic gain control comprising, in cascade, an input transducer, an amplifier, and an output transducer, and an automatic gain control circuit comprising a variable resistor for taking off an alternating voltage that varies in amplitude with a signal from the input transducer, a rectifier for rectifying the alternating voltage such that the output voltage of the rectifier decreases when the alternating voltage across the variable resistor increases, a filter coupled to the rectifier and having an output connected to the base of a first transistor which is driven into a less conductive state as the voltage across the variable resistor increases, means coupling the collector of the first transistor to the base of a second transistor of the same conductivity type as the first transistor, and means connecting the collector of the second transistor to the input of the amplifier such that the second transistor by-passes the input signal of said amplifier to a greater degree as the signal across the variable resistor increases.

12. An amplifier circuit as claimed in claim 11 further comprising means connected to the base of the first transistor for biasing said first transistor into a saturated condition.

13. An amplifier circuit as claimed in claim 11 wherein said first and second transistors are NPN transistors and said filter includes a capacitor connected across the base-emitter junction of the first transistor, said second transistor being connected in circuit such that the base-emitter current of the second transistor flows through a separate path that by-passes the base-emitter current path of the first transistor.

14. An amplifier circuit as claimed in claim 13 wherein the variable resistor is coupled to the output of the amplifier.

15. An amplifier circuit as claimed in claim 11 further comprising means providing a DC connection between the base of the first transistor and a terminal of a source of DC voltage for the amplifier circuit, and wherein the collector of the first transistor is directly connected to the base of the second transistor to form a common circuit point that is DC connected to said terminal of the DC voltage source.

* * * * *